(12) United States Patent
Yuan et al.

(10) Patent No.: US 8,481,415 B2
(45) Date of Patent: Jul. 9, 2013

(54) SELF-ALIGNED CONTACT COMBINED WITH A REPLACEMENT METAL GATE/HIGH-K GATE DIELECTRIC

(75) Inventors: Jun Yuan, Fishkill, NY (US); Dechao Guo, Wappingers Falls, NY (US); Kwong Hon Wong, Wappingers Falls, NY (US); Yanfeng Wang, Fishkill, NY (US); Gan Wang, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 351 days.

(21) Appl. No.: 12/958,608

(22) Filed: Dec. 2, 2010

(65) Prior Publication Data

US 2012/0139062 A1 Jun. 7, 2012

(51) Int. Cl.
*H01L 21/00* (2006.01)

(52) U.S. Cl.
USPC ............... 438/585; 438/586; 438/183

(58) Field of Classification Search
USPC ........................... 438/585–586, 183
See application file for complete search history.

(56) References Cited

U.S. PATENT DOCUMENTS

| | | | |
|---|---|---|---|
| 6,033,963 A | 3/2000 | Huang et al. | |
| 6,392,280 B1 | 5/2002 | Besser et al. | |
| 6,492,249 B2 | 12/2002 | Xiang et al. | |
| 6,756,277 B1 | 6/2004 | Yu | |
| 7,148,548 B2 | 12/2006 | Doczy et al. | |
| 7,208,361 B2 | 4/2007 | Shah et al. | |
| 7,781,321 B2* | 8/2010 | Gambino et al. | 438/587 |
| 7,985,690 B2* | 7/2011 | Thei et al. | 438/706 |
| 8,030,718 B2* | 10/2011 | Huang et al. | 257/412 |
| 8,035,165 B2* | 10/2011 | Yeh et al. | 257/369 |
| 8,048,810 B2* | 11/2011 | Tsai et al. | 438/703 |
| 8,058,125 B1* | 11/2011 | Lin et al. | 438/238 |
| 8,093,120 B2* | 1/2012 | Yeh et al. | 438/199 |
| 8,097,500 B2* | 1/2012 | Ando et al. | 438/197 |
| 8,258,062 B2* | 9/2012 | Richter et al. | 438/689 |
| 8,283,222 B2* | 10/2012 | Hsu et al. | 438/183 |
| 8,334,197 B2* | 12/2012 | Lee et al. | 438/591 |
| 8,334,198 B2* | 12/2012 | Chen et al. | 438/595 |
| 8,338,242 B2* | 12/2012 | Hsu et al. | 438/183 |
| 8,361,848 B2* | 1/2013 | Lee et al. | 438/171 |
| 8,367,495 B2* | 2/2013 | Beyer et al. | 438/216 |
| 8,367,563 B2* | 2/2013 | Yeh et al. | 438/791 |
| 2007/0210448 A1* | 9/2007 | Wong et al. | 257/734 |
| 2009/0181505 A1* | 7/2009 | Ando et al. | 438/216 |
| 2009/0189201 A1 | 7/2009 | Chang et al. | |
| 2009/0280631 A1* | 11/2009 | Gambino et al. | 438/588 |

(Continued)

*Primary Examiner* — Laura Menz
(74) *Attorney, Agent, or Firm* — Scully, Scott, Murphy & Presser, P.C.; Joseph P. Abate, Esq.

(57) ABSTRACT

A method of forming a semiconductor device is provided that includes forming a replacement gate structure on portion a substrate, wherein source regions and drain regions are formed on opposing sides of the portion of the substrate that the replacement gate structure is formed on. An intralevel dielectric is formed on the substrate having an upper surface that is coplanar with an upper surface of the replacement gate structure. The replacement gate structure is removed to provide an opening to an exposed portion of the substrate. A high-k dielectric spacer is formed on sidewalls of the opening, and a gate dielectric is formed on the exposed portion of the substrate. Contacts are formed through the intralevel dielectric layer to at least one of the source region and the drain region, wherein the etch that provides the opening for the contacts is selective to the high-k dielectric spacer and the high-k dielectric capping layer.

15 Claims, 9 Drawing Sheets

U.S. PATENT DOCUMENTS

| | | | |
|---|---|---|---|
| 2010/0052075 A1* | 3/2010 | Yeh et al. | 257/410 |
| 2010/0059823 A1* | 3/2010 | Chung et al. | 257/355 |
| 2010/0065925 A1* | 3/2010 | Huang et al. | 257/410 |
| 2010/0197141 A1* | 8/2010 | Tu et al. | 438/702 |
| 2010/0244141 A1* | 9/2010 | Beyer et al. | 257/369 |
| 2010/0285658 A1* | 11/2010 | Yeh et al. | 438/586 |
| 2010/0301427 A1* | 12/2010 | Lenski et al. | 257/392 |
| 2010/0311231 A1* | 12/2010 | Thei et al. | 438/587 |
| 2010/0330808 A1* | 12/2010 | Richter et al. | 438/691 |
| 2011/0081774 A1* | 4/2011 | Yeh et al. | 438/591 |
| 2011/0147858 A1* | 6/2011 | Lim et al. | 257/412 |
| 2011/0159678 A1* | 6/2011 | Hsu et al. | 438/587 |
| 2011/0189847 A1* | 8/2011 | Tsai et al. | 438/595 |
| 2011/0244670 A1* | 10/2011 | Richter et al. | 438/585 |
| 2011/0266637 A1* | 11/2011 | Lee et al. | 257/410 |
| 2011/0284966 A1* | 11/2011 | Wen et al. | 257/368 |
| 2011/0303982 A1* | 12/2011 | Chung et al. | 257/363 |
| 2012/0001263 A1* | 1/2012 | Richter et al. | 257/368 |
| 2012/0003804 A1* | 1/2012 | Huang et al. | 438/286 |
| 2012/0045889 A1* | 2/2012 | Yeh et al. | 438/586 |
| 2012/0049247 A1* | 3/2012 | Lee et al. | 257/288 |
| 2012/0139062 A1* | 6/2012 | Yuan et al. | 257/411 |
| 2012/0211837 A1* | 8/2012 | Baars et al. | 257/368 |
| 2012/0220113 A1* | 8/2012 | Liao et al. | 438/585 |
| 2012/0244669 A1* | 9/2012 | Liao et al. | 438/212 |
| 2012/0261765 A1* | 10/2012 | Beyer et al. | 257/369 |
| 2012/0264281 A1* | 10/2012 | Chen et al. | 438/591 |
| 2012/0315749 A1* | 12/2012 | Hempel et al. | 438/591 |
| 2013/0015580 A1* | 1/2013 | Jain et al. | 257/751 |
| 2013/0017679 A1* | 1/2013 | Lenski et al. | 438/591 |
| 2013/0034942 A1* | 2/2013 | Pal et al. | 438/285 |

* cited by examiner

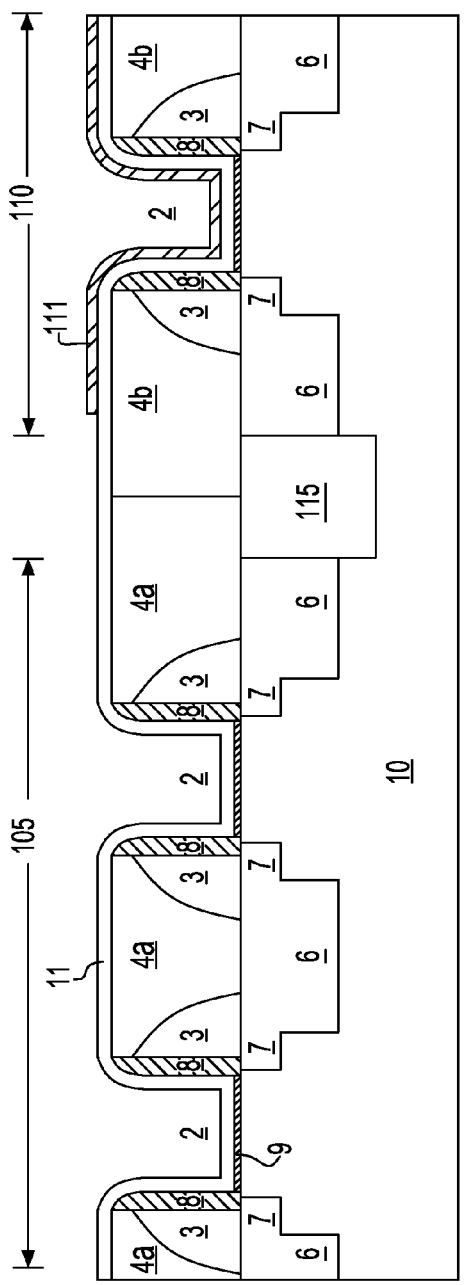

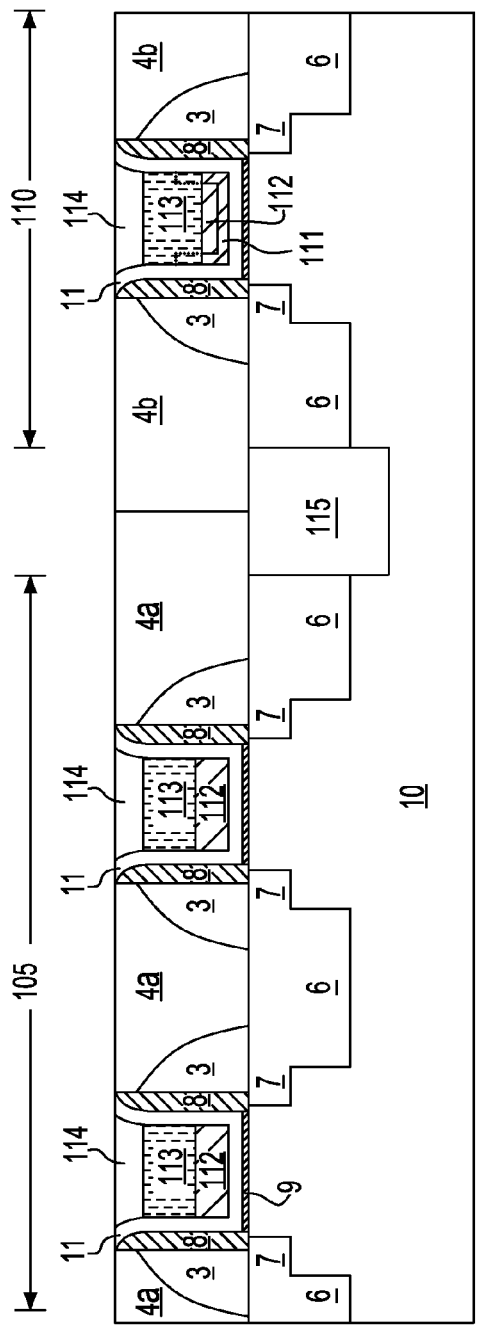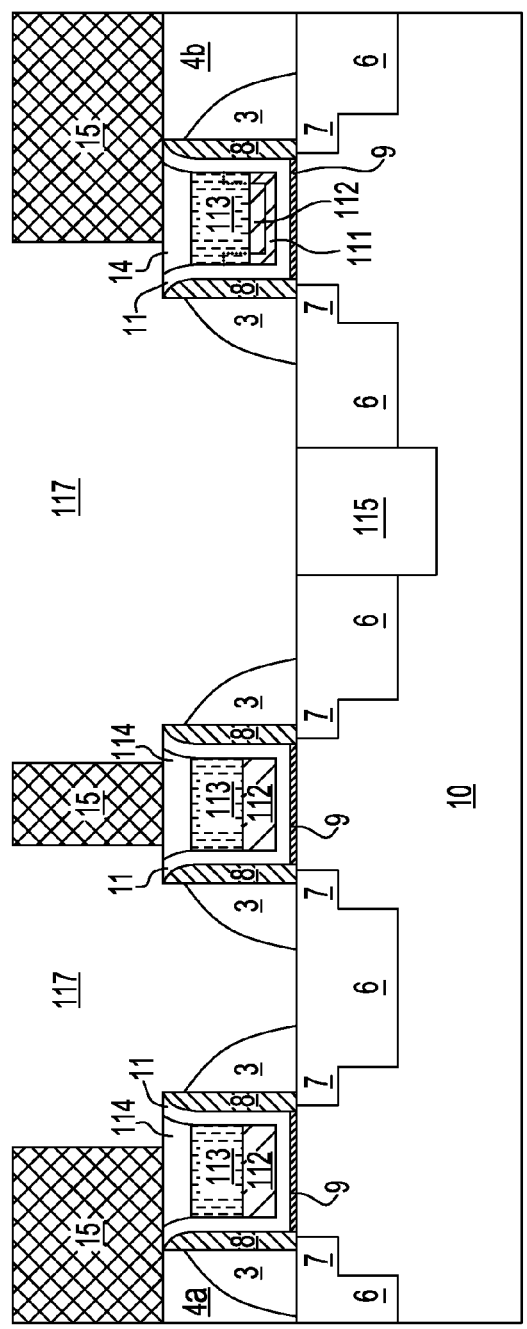

SELF-ALIGNED CONTACT COMBINED WITH A REPLACEMENT METAL GATE/HIGH-K GATE DIELECTRIC

BACKGROUND

The present disclosure relates to semiconductor structures and a method of fabricating such semiconductor structures, in which contacts to the source and drain regions of the semiconductor structure are formed using a self-aligned process.

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

SUMMARY

A method of forming a semiconductor device is provided that includes forming a replacement gate structure on a portion of a substrate, wherein source regions and drain regions are formed on opposing sides of the portion of the substrate that the replacement gate structure is formed on. An intralevel dielectric is formed on the substrate having an upper surface that is coplanar with an upper surface of the replacement gate structure. The replacement gate structure is removed to provide an opening to an exposed portion of the substrate. A high-k dielectric spacer is formed on the sidewalls of the opening. A gate dielectric is formed on the exposed portion of the substrate. A functioning gate structure is formed on within the opening on the gate dielectric. The upper surface of the functioning gate structure includes a high-k dielectric capping layer. Contacts are formed through the intralevel dielectric layer to at least one of the source region and the drain region, wherein an etch that provides the openings for the contacts is selective to the high-k dielectric spacer and the high-k dielectric capping layer.

In another embodiment, a method of forming a complementary metal oxide semiconductor (CMOS) device is provided that includes providing a first replacement gate structure within a first device region of a substrate and a second replacement gate structure within a second device region of the substrate. The first device region comprises first source regions and first drain regions of a first conductivity type and the second device region comprises second source regions and second drain regions of a second conductivity type. An intralevel dielectric is formed on the substrate having an upper surface that is coplanar with an upper surface of the first replacement gate structure and the second replacement gate structure. The first replacement gate structure and the second replacement gate structure are removed to provide openings to a first exposed portion of the substrate in the first device region and a second exposed portion of the substrate in the second device region of the substrate. A high-k dielectric spacer is formed on sidewalls of each of the openings to the first exposed portion of the substrate and the second exposed portion of the substrate. A gate dielectric is formed on each of the first exposed portion and the second exposed portion of the substrate. A first work function metal layer is formed in direct contact with the gate dielectric that is present in the first device region and a second work function metal layer is formed in direct contact with the gate dielectric in the second device region of the substrate. A high-k dielectric capping layer is formed overlying the first work function metal layer and the second work function metal layer. Contacts are formed through the intralevel dielectric layer to at least one of the source region and the drain region. The etch that provides the openings for the contacts is selective to the high-k dielectric spacer and high-k dielectric capping layer.

In another aspect, a semiconductor device is provided. The semiconductor device includes a gate structure that is composed of a gate conductor and a high-k gate dielectric layer. The high-k gate dielectric layer is in contact with the base of the gate conductor and the sidewalls of the gate conductor. A high-k dielectric capping layer is present on an upper surface of the gate conductor. Source regions and drain regions are present in the substrate on opposing sides of the gate structure.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which:

FIG. 13 is a side cross-sectional view of another embodiment of the present disclosure that selects the work function metal to correspond to the conductivity type of the devices within a complementary metal oxide semiconductor (CMOS) device, in which the layer of a second work function metal layer is formed within the second device region of the substrate that is depicted in FIG. 4.

FIG. 14 is a side cross-sectional view of forming a first metal work function metal layer within the openings in the first and second device regions of the substrate, in accordance with one embodiment of the present disclosure.

FIG. 15 is a side cross-sectional view of forming a metal-containing layer filling the openings in the first and second device regions, and forming a high-k dielectric capping layer on the recessed surface of the metal-containing layer, in accordance with one embodiment of the present disclosure.

FIGS. 16 and 17 are side cross-sectional views of forming contacts through the intralevel dielectric layer to at least one of the source region and the drain region, using an etch that provides the openings for the contacts which is selective to the high-k dielectric spacer, in accordance with one aspect of the present disclosure.

DETAILED DESCRIPTION

Figure 1:
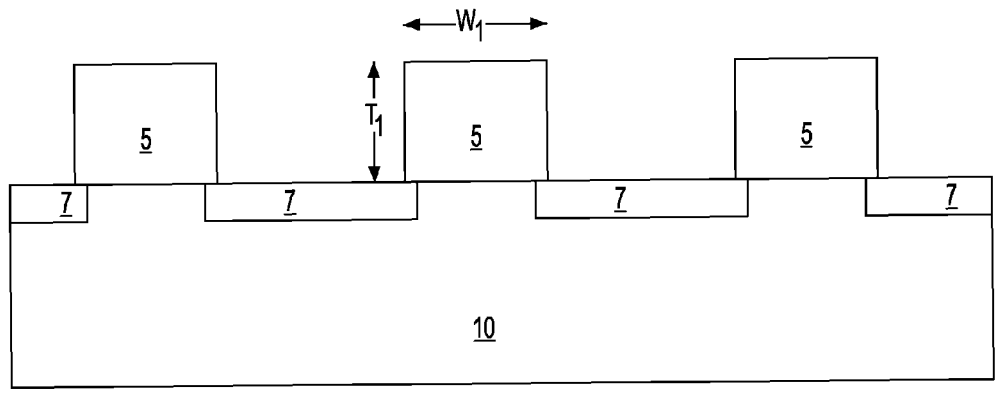
FIG. 1 is a side cross-sectional view of forming a replacement gate structure on portion a substrate, in accordance with one embodiment of the present disclosure.

Detailed embodiments of the present disclosure are described herein; however, it is to be understood that the disclosed embodiments are merely illustrative of the present disclosure that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one embodiment, the present disclosure relates to scaling of semiconductor devices. As semiconductor device scaling increases, i.e., the device technology decreases in size, the likelihood increases that the contact to the source regions and the drain regions can short to the gate conductors of the gate structure. As used herein, a "semiconductor device" is an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. The doping of the source and drain regions of the semiconductor device dictate the conductivity type of the semiconductor device. As used herein, the term "conductivity type" denotes a semiconductor device being p-type or n-type. As used herein, "p-type" refers to the addition of impurities to an intrinsic semiconductor that creates deficiencies of valence electrons. In a silicon-containing substrate, examples of p-type dopants, i.e., impurities, include but are not limited to boron, aluminum, gallium and indium. As used herein, "n-type" refers to the addition of impurities that contributes free electrons to an intrinsic semiconductor. In a silicon containing substrate examples of n-type dopants, i.e., impurities, include but are not limited to, antimony, arsenic and phosphorous.

In one embodiment, the semiconductor device that is provided by the present disclosure is a field effect transistor. A field effect transistor is a semiconductor device in which output current, i.e., source-drain current, is controlled by the voltage applied to a gate structure. A field effect transistor has three terminals, i.e., a gate structure, a source region and a drain region. The gate structure controls output current, i.e., flow of carriers in the channel, of a semiconducting device, such as a field effect transistor, through electrical or magnetic fields. The channel is the region between the source region and the drain region of a semiconductor device that becomes conductive when the semiconductor device is turned on. A p-type conductivity semiconductor device, such as a pFET, is a semiconductor device in which the source and drain regions of the device are doped with a p-type dopant. An n-type conductivity semiconductor device, such as an nFET, is a semiconductor device in which the source and drain regions of the device are doped with an n-type dopant.

In some embodiments, the present disclosure provides a process sequence that employs replacement gate technology and a self aligned contact method that substantially eliminates shorting between the gate conductor of the gate structure and the contacts to the source and drain regions of the semiconductor device. In one embodiment, the self aligned contact method is provided by employing high-k dielectric spacers and a high-k dielectric capping layer that encapsulates at least the gate conductor of the gate structure. The material of the high-k dielectric spacers and the high-k dielectric capping layer protect the gate conductor of the gate structure during the etch process that forms the vias for the contacts to the source and drain regions. More specifically, the high-k dielectric spacers function as an etch stop layer to protect the gate conductor during the etch process that forms the openings through the intralevel dielectric layer to the source and drain regions in which the contacts are subsequently formed. By protecting the gate conductor from the etch process that forms the vias to the source and drain regions, the contact etch process may be referred to as being self aligned to the source and drain regions. The methods and structures disclosed herein are now described in more detail with reference to FIGS. 1-16.

FIG. 1 depicts forming a replacement gate structure 5 on a portion of a substrate 10. The substrate 10 may be any silicon-containing substrate including, but not limited to, Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures. The substrate 10 may also include a first doped (n- or p-) region, and a second doped (n- or p-) region. For clarity, the doped regions are not specifically labeled in the drawings of the present application. These doped regions are known as "wells". The substrate may also be composed of compound semiconductor materials, such as type III-V semiconductor.

In one embodiment, the substrate 10 includes an isolation region (not shown) separating device regions of different conductivities. In one embodiment, the isolation region is formed by forming a trench in the substrate 10 utilizing a dry etching process, such as reactive-ion etching (RIE) or plasma etching, and then filling the trench with an insulating material, such as an oxide. In one embodiment, the trench may be filled using a deposition method, such as chemical vapor deposition (CVD).

The replacement gate structure 5 which includes sacrificial material that defines the geometry of a later formed gate structure that functions to switch the semiconductor device from an "on" to "off" state, and vice versa. In one embodiment, as illustrated in FIG. 1, the replacement gate structure 5 may be composed of a single layer of sacrificial material. In another embodiment, the replacement gate structure 5 includes a sacrificial material stack (not depicted) on the substrate 10, in which the sacrificial material stack may be composed of a plurality of layers of sacrificial material.

In one embodiment, the replacement gate structure 5 may be composed of a semiconductor-containing material, such as a silicon-containing material. Silicon-containing materials that are suitable for the replacement gate structure include, but are not limited to, silicon (Si), single crystal silicon, polycrystalline silicon, amorphous silicon, $SiO_2$, $Si_3N_4$, $SiO_xN_y$, SiC, SiCO, SiCOH, and SiCH compounds, and the above-mentioned silicon-containing materials with some or all of the Si replaced by Ge. In one example, the sacrificial material that provides the replacement gate structure 5 is amorphous silicon. In some embodiments, other materials, such as dielectrics and metals, can be employed as the sacrificial material of the replacement gate structure 5, so long as the material selected can be removed selective to the substrate 10 and the subsequently formed intralevel dielectric.

The sacrificial material layer that provides the replacement gate structure 5 may be formed using a deposition process, such as chemical vapor deposition (CVD). Chemical vapor deposition (CVD) is a deposition process in which a deposited species is formed as a result of chemical reaction between gaseous reactants at an elevated temperature (typically being greater than 200° C.), wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The sacrificial material may also be deposited using evaporation, chemical solution deposition, spin on deposition, and physical vapor deposition (PVD) methods.

The sacrificial material may be patterned and etched to provide the replacement gate structure 5. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected, while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied.

In one embodiment, the etch process removes the exposed portions of the sacrificial material layer with an etch chemistry that is selective to the substrate 10. In one another embodiment, the etch process that forms the replacement gate structure 5 is an anisotropic etch. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

The width W1 of the replacement gate structure 5 of may range from 20 nm to 250 nm. In another embodiment, the width W1 of the replacement gate structure 5 may range from about 50 nm to 150 nm. In yet another embodiment, the width W1 of the replacement gate structure 5 may range from 80 nm to 100 nm. The thickness T1 of the replacement gate structure 5 may range from 50 nm to 500 nm. In another embodiment, the thickness T1 of the replacement gate structure 5 may range from about 100 nm to about 200 nm. In yet another embodiment, the thickness T1 of the replacement gate structure 5 of sacrificial material may range from 125 nm to 175 nm.

The spacing between adjacent replacement gate structures 5 dictates the pitch of the subsequently formed gate structures. The term "pitch" means the center-to-center distance between two repeating elements of a circuit including semiconductor devices. In one embodiment, the pitch may be measured from the center of the upper surface of a first replacement gate structure to the center of the upper surface of an adjacent replacement gate structure. The actual dimensions for the pitch may depend upon the technology node. In one example, the gate pitch is selected to correspond to the 20 nm technology node. In this example, the gate pitch ranges from 80 nm to 100 nm.

In a following process step, source and drain extension regions 7 may be formed in the substrate 10 and partially extend under each replacement gate structure 5. Source and drain extension regions 7 are formed via ion implantation. The p-type conductivity semiconductor devices are produced within Si-containing substrates by doping the source and drain extension regions 7 with elements from group III-A of the Periodic Table of Elements. The n-type conductivity semiconductor devices are produced within Si-containing substrates by doping the source and drain extension regions 7 with elements from group V-A of the Periodic Table of Elements. In the embodiment that is depicted in FIG. 1, a plurality of semiconductor devices having the same conductivity type are formed on the same substrate 10, in which the adjacent semiconductor devices have a shared source and drain extension region 7. In another embodiment, semiconductor devices of different conductivity type may be formed on the same substrate 10 and are isolated from semiconductor devices of opposing conductivity type with isolation regions, such as shallow trench isolation regions. In these embodiments, the source and drain extension regions that are formed to a first conductivity type semiconductor device, e.g., n-type conductivity, are separated from the source and drain extension regions of a second conductivity type semiconductor device, e.g., p-type conductivity, by an isolation region, such as a shallow trench isolation (STI) region.

Figure 2:
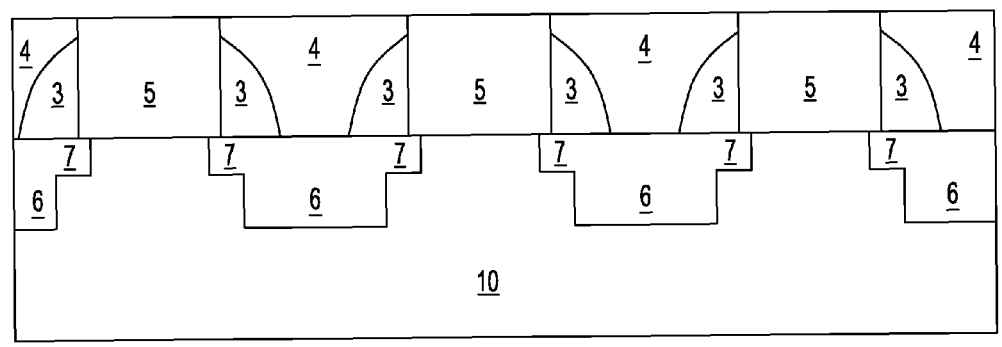
FIG. 2 is a side cross-sectional view of forming low-k dielectric spacers adjacent to the replacement gate structure, and forming an intralevel dielectric on the substrate having an upper surface that is coplanar with an upper surface of the replacement gate structure, in accordance with one embodiment of the present disclosure.

Referring to FIG. 2, a low-k dielectric spacer 3 is formed abutting the sidewall surface of the replacement gate structure 5. The term "low-k" refers to a dielectric material having a dielectric constant that is less than 4.0 at room temperature, i.e., 20° C. to 25° C. In one embodiment, the low-k dielectric spacer 3 has a dielectric constant ranging from 1.75 to 3.5. In another embodiment, the low-k dielectric spacer 3 has a dielectric constant ranging from 2.0 to 3.2. In yet an even further embodiment, the low-k dielectric spacer 3 has a dielectric constant ranging from 2.25 to 3.0. Examples of materials suitable for the low-k dielectric spacer 3 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methyl-silsesquioxane (MSQ), and combinations thereof. In one example, the low-k dielectric spacer 3 may be composed of silicon oxide ($SiO_2$).

The low-k dielectric spacer 3 may be formed by deposition and etching. The width of the low-k dielectric spacer 3 should be sufficiently wide such that the source and drain metal semiconductor alloy contacts (to be subsequently formed) do not encroach underneath the edges of each of the subsequently formed gate structure. Also, the widths of the low-k dielectric spacer 3 should be sufficiently wide enough so that the deep source/drain implants also do not encroach significantly into the channel region of the semiconductor device to cause short channel effects. Typically, the source and drain metal semiconductor alloy contacts. does not encroach underneath the edges of the gate structure 5 when the low-k dielectric spacer 3 has a width, as measured at the bottom, of 20 nm or greater.

Following low-k dielectric spacer 3 formation, a higher energy ion implant is conducted to form deep source and drain regions 6. These implants are conducted at a higher energy and higher concentration of dopant than the source and drain extension region 7 implant. The deep source and drain regions 6 are typically doped with a conductivity type consistent with the source and drain extension regions 7. The deep source and drain regions 6 and source and drain extension regions 7, are activated by activation annealing. Activation anneal may be conducted at a temperature ranging from 850° C. to 1350° C.

Metal semiconductor alloy contacts (not shown) may be formed on an upper surface of the deep source and drain regions 6 and the source and drain extension regions 7. In one embodiment, the metal semiconductor alloy contacts are composed of a silicide. Silicide formation includes forming a metal capable of reacting with silicon (Si) atop the entire structure, heating the structure to form a silicide, removing non-reacted metal, and, if needed, conducting a second heating step.

Still referring to FIG. 2, an intralevel dielectric layer 4 is formed on the substrate 10 having an upper surface that is coplanar with an upper surface of the replacement gate structure 5. The intralevel dielectric layer 4 may be blanket deposited atop the entire substrate 10 and planarized. The blanket dielectric may be selected from the group consisting of silicon-containing materials such as $SiO_2$, $Si_3N_4$, $SiO_xN_y$, SiC, SiCO, SiCOH, and SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon, α-C:H). Additional choices for the blanket dielectric includes any of the aforementioned materials in porous form, or in a form that changes during processing to or from being porous and/or permeable to being non-porous and/or non-permeable.

The intralevel dielectric layer 4 may be formed using a deposited process, such as chemical vapor deposition (CVD). Variations of CVD processes that are suitable for forming the intralevel dielectric layer 4 include, but are not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The intralevel dielectric layer 4 may also be deposited using evaporation, chemical solution deposition, spin on deposition, and physical vapor deposition (PVD) methods.

Following deposition, the intralevel dielectric layer 4 may be planarized so that the upper surface of the intralevel dielectric layer 4 is coplanar with the upper surface of the replacement gate structure 5, as depicted in FIG. 2. Planarization is a material removal process that employs at least mechanical forces, such as frictional media, to produce a planar surface. The intralevel dielectric layer 4 may be planarized using chemical mechanical planarization (CMP). Chemical mechanical planarization (CMP) is a material removal process using both chemical reactions and mechanical forces to remove material and planarize a surface.

In some embodiments, the intralevel dielectric layer 4 may be a stress-inducing material. For example, when the semiconductor devices are n-type semiconductor devices, such as nFETs, tensile stress-inducing materials induce an increase in the speed of the charge carriers in the n-type semiconductor devices. For example, the stress on the channel of the n-type semiconductor device that is induced by a tensile stress-inducing material may range from 100 MPa to 3000 MPa.

In another example, when the semiconductor devices are p-type semiconductor devices, such as pFETs, compressive stress-inducing materials induce an increase in the speed of the change carrier in the p-type semiconductor devices. For example, the stress on the channel of the p-type semiconductor device that is induced by an overlying compressive stress-inducing material may range from 100 MPa to 5000 MPa.

In one embodiment, the stress inducing material is a comprised of a nitride, e.g., silicon nitride. Other examples of materials for the stress inducing material include silicon carbide, carbon film, silicon oxynitride, boron nitride, and combinations thereof. The stress inducing material is typically blanket deposited atop the substrate 10 and the replacement gate structures 5. Plasma enhanced chemical vapor deposition (PECVD) is one example of a deposition method that can provide stress inducing material composed of nitride, e.g., silicon nitride, and having a compressive or tensile internal stress. The stress state of nitride-containing stress inducing material deposited by PECVD can be controlled by changing the deposition conditions to alter the reaction rate within the deposition chamber. More specifically, the stress state of a stress inducing material comprised of silicon nitride may be set by changing the deposition conditions such as, $SiH_4/N_2/$ He gas flow rate, pressure, RF power, and electrode gap. Although wishing not to be limited, it is believed that the incorporation of H into the nitride-containing stress inducing material increases the compressive nature of the layer. Rapid thermal chemical vapor deposition (RTCVD) can provide nitride-containing stress inducing material having an internal tensile stress. The magnitude of the internal tensile stress produced within nitride-containing stress inducing material deposited by RTCVD can be controlled by changing the deposition conditions. More specifically, the magnitude of the tensile stress within stress inducing material comprised of silicon nitride may be set by changing deposition conditions such as, precursor composition, precursor flow rate and temperature.

Similar to non-stress inducing materials that provide the intralevel dielectric layer 4, following deposition the stress inducing material may be planarized so that the upper surface of the stress inducing material is coplanar with the upper surface of the replacement gate structure 5. The planarization process may be provided by chemical mechanical planarization (CMP).

Figure 3:
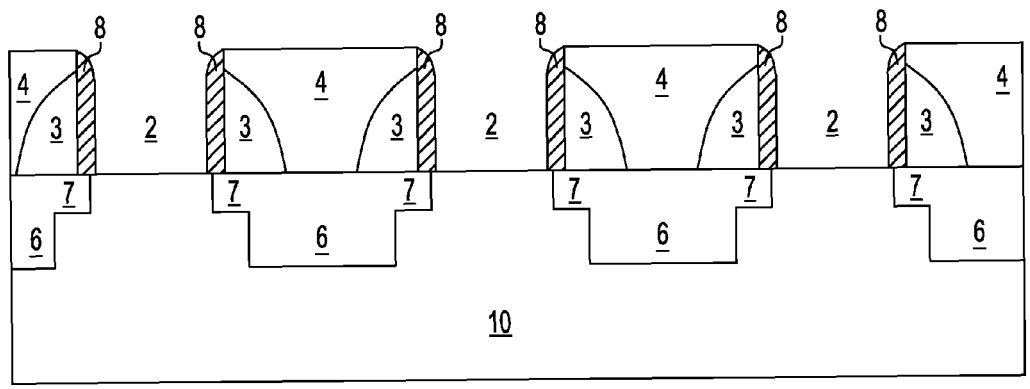
FIG. 3 is a side cross-sectional view of removing the replacement gate structure to provide an opening to an exposed portion of the substrate and forming a high-k dielectric spacer on sidewalls of the opening, in accordance with one embodiment of the present disclosure.

FIG. 3 depicts one embodiment of removing the replacement gate structure 5 to provide an opening 2 to an exposed portion of the substrate 10. The replacement gate structure 5 is typically removed using a selective etch process that removes the replacement gate structure 5 selective to the substrate 10, the low-k dielectric spacer 3 and the intralevel dielectric 4. The etch may be an isotropic etch or an anisotropic etch. The anisotropic etch may include reactive-ion etching (RIE). Other examples of anisotropic etching that can be used at this point of the present disclosure include ion beam etching, plasma etching or laser ablation. In comparison to anisotropic etching, isotropic etching is non-directional. One example of an isotropic etch is a wet chemical etch. In one embodiment, in which the replacement gate structure 5 is composed of polysilicon, the substrate 10 is a silicon-containing material, and the low-k dielectric spacer 3 is composed of silicon oxide ($SiO_2$), the intralevel dielectric 4 is composed of nitride ($Si_3N_4$), the wet etch chemistry for removing the replacement gate structure 5 may be composed of DHF and hot $NH_3$, or TetraMethyl Ammonium Hydroxide (TMAH).

FIG. 3 further depicts one embodiment of forming a high-k dielectric spacer 8 on sidewalls of the opening 2, i.e., sidewalls of the low-k dielectric spacer 3. The term "high-k" denotes a material having a dielectric constant that is greater than the dielectric constant of silicon oxide ($SiO_2$) at room temperature, i.e., 20° C. to 25° C. The high-k dielectric spacer 8 may be composed of an oxide, a nitride, an oxynitride or combinations and multi-layers thereof. In one embodiment, the high-k dielectric spacer 8 is comprised of a material having a dielectric constant that is greater than 4.0, e.g., 4.1. In another embodiment, the high-k dielectric spacer 8 is comprised of a material having a dielectric constant greater than 7.0. In yet another embodiment, the high-k dielectric spacer 8 is comprised of a material having a dielectric constant ranging from greater than 4.0 to 30. The dielectric constants mentioned herein are relative to a vacuum at room temperature, i.e., 20° C. to 25° C.

Some examples of high-k dielectric materials suitable for the high-k dielectric spacer 8 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the high-k dielectric spacer 8 is hafnium oxide ($HfO_2$). It is noted that other materials, may be selected for the high-k dielectric spacer 8, so long as the material selected protects the gate conductors of the subsequently formed gate structure during the process sequence that provides the openings to the source and drain regions for the contacts.

The high-k dielectric spacer 8 is formed using deposition and etch methods. In one embodiment, the high-k dielectric spacer 8 is formed by depositing a layer of high-k dielectric material and then etching the layer of the high-k dielectric material so that the remaining portion of the layer of high-k dielectric material is present on the sidewalls of the opening 2 to provide the high-k dielectric spacer 8.

In one embodiment, the layer of high-k dielectric material is a conformal layer that is formed using a conformal deposition process. The term "conformal" denotes a layer having a thickness that does not deviate from greater than or less than 30% of an average value for the thickness of the layer. In one example, the layer of the high-k dielectric material is formed on the upper surface of the intralevel dielectric 4, the exposed sidewall surfaces of the low-k dielectric spacer 3 that provide the sidewalls of the opening 2, and the base of the opening 2, i.e., exposed portion of the substrate 10.

In one embodiment, the layer of the high-k dielectric material is formed using a deposition process, such as chemical vapor deposition (CVD). Variations of chemical vapor deposition (CVD) processes for depositing the layer of the high-k dielectric material include, but are not limited to, Atmospheric Pressure CVD (APCVD), Low Pressure CVD (LPCVD) and Plasma Enhanced CVD (PECVD), Metal-Organic CVD (MOCVD) and others. One example of a conformal deposition process is plasma enhanced chemical vapor deposition (PECVD). In another embodiment, the layer of the high-k dielectric material may be formed by a thermal growth process such as, for example, oxidation, nitridation or oxynitridation.

The layer of high-k dielectric material may then be etched using an anisotropic etch process, such as reactive ion etch (RIE). By employing a directional etch, i.e., anisotropic etch, the etch removes the portions of the layer of the high-k dielectric material that are on horizontal surfaces, such as the upper surface of the intralevel dielectric 4, but only recesses the portions of the layer of the high-k dielectric material that are present on vertical surfaces, such as the sidewalls of the low-k dielectric spacer 3. More specifically, in one embodiment, the anisotropic etch removes the portion of the layer of the high-k dielectric material that is present at the base of the opening 2 to expose the underlying portion of the substrate 10 and the portion of the layer of the high-k dielectric material that is present on the upper surface of the intralevel dielectric 4, wherein the remaining portion of the layer of the high-k dielectric material is present in direct contact with sidewall of the low-k dielectric spacer 3 and provides the high-k dielectric spacer 8.

The anisotropic etch can remove the layer of the high-k dielectric material in its entirety from the horizontal surfaces, without substantially etching the portion of the high-k dielectric material that is present on the sidewalls of the low-k dielectric spacer, because the vertical thickness of the portion of the layer of the high-k dielectric material that is present on the vertical surfaces is substantially greater than the vertical thickness of the layer of the high-k dielectric material that is present on the horizontal surfaces. The anisotropic etch removes the material being etched, i.e., the layer of the high-k dielectric material, in the vertical direction.

The high-k dielectric spacer 8 has a width as measured from the sidewall of the low-k dielectric spacer 3 that ranges from 0.5 nm to 10 nm. In another embodiment, the high-k dielectric spacer 8 has a width as measured from the sidewall of the low-k dielectric spacer 3 that ranges from 1 nm to 5 nm.

Figure 4:
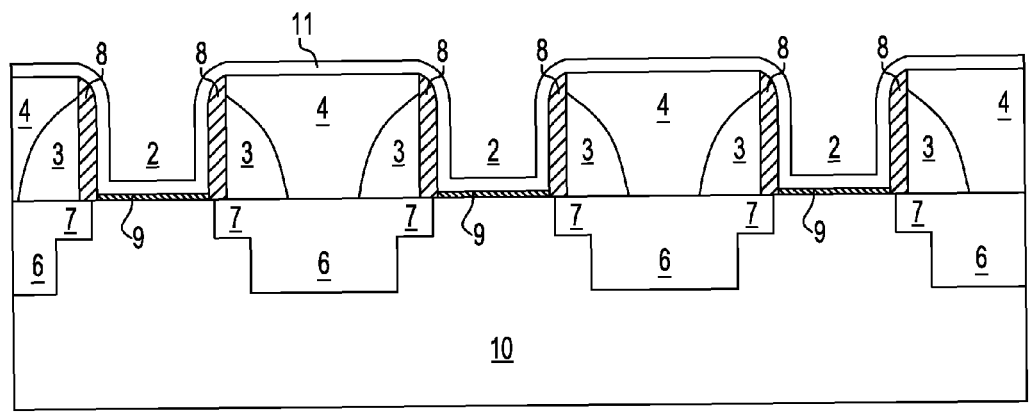
FIG. 4 is a side cross-sectional view of forming an interfacial dielectric layer on a base portion of the opening, and forming a high-k gate dielectric layer on the interfacial dielectric layer, in accordance with one embodiment of the present disclosure.

FIG. 4 depicts one embodiment of forming an interfacial dielectric layer 9 on a base portion of the opening 2, and forming a high-k gate dielectric layer 11 on the interfacial dielectric layer 9. The interfacial dielectric layer 9 is typically provided by thermal oxidation of the exposed surface of the substrate 10 that is present at the base of the opening 2. In one embodiment, thermal oxidation of silicon is performed in the presence of oxygen at a temperature between 800° C. and 1200° C. In some examples, the oxidant may be either water vapor (steam) or molecular oxygen. In another embodiment, the interfacial dielectric layer 9 is an oxide that is formed using deposition. In some embodiments, the interfacial dielectric layer 9 is composed of silicon oxide and has a thickness that ranges from 1 nm to 5 nm.

The high-k gate dielectric layer 11 may be deposited on the base portion of the opening 2, the sidewalls of the high-k dielectric spacer 8 and the upper surface of the intralevel dielectric 4. Similar to the high-k dielectric spacer 8, the high-k gate dielectric layer 11 may be composed of an oxide, a nitride, an oxynitride or combinations and multi-layers thereof. In one embodiment, the high-k gate dielectric layer 11 is comprised of a material having a dielectric constant that is greater than 4.0, e.g., 4.1. In another embodiment, the high-k gate dielectric layer 11 is comprised of a material having a dielectric constant greater than 7.0. In yet another embodiment, the high-k gate dielectric layer 11 is comprised of a material having a dielectric constant ranging from greater than 4.0 to 30. The dielectric constants mentioned herein are relative to a vacuum at room temperature, i.e., 20° C. to 25° C.

Some examples of suitable materials for the high-k gate dielectric layer 11 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the high-k gate dielectric layer 11 is hafnium oxide ($HfO_2$).

In one embodiment, the high-k gate dielectric layer 11 is a conformal layer that is formed using a conformal deposition process. In one embodiment, the high-k gate dielectric layer 11 is formed using a deposition process, such as chemical vapor deposition (CVD). In another embodiment, the high-k gate dielectric 11 may be formed by a thermal growth process such as, for example, oxidation, nitridation or oxynitridation. The high-k gate dielectric layer 11 may have a thickness ranging from 1 nm to 5 nm. In another embodiment, the high-k gate dielectric layer 11 has a thickness ranging from 1 nm to 2.5 nm. In yet another example, the high-k gate dielectric layer 11 has a thickness that ranges from 15 Å to 20 Å.

Figure 5:
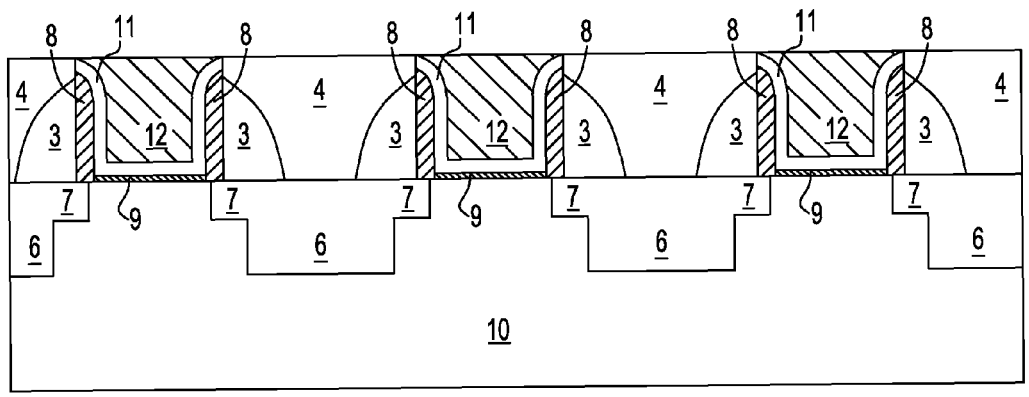
FIG. 5 is a side cross-sectional view of forming a work functional metal layer filling the opening and planarizing the upper surface of the work function metal layer so that the upper surface of the remaining portion of the work function metal layer is coplanar with an upper surface of an intralevel dielectric layer, in accordance with one embodiment of the present disclosure.

FIG. 5 depicts forming a work functional metal layer 12 filling the opening and planarizing the upper surface of the work function metal layer 12 so that the upper surface of the remaining portion of the work function metal layer 12 is coplanar with an upper surface of an intralevel dielectric layer 4. The work function metal layer 12 is formed in direct contact with an upper surface of the high-k gate dielectric layer 11.

In one embodiment, in which the semiconductor device is an n-type semiconductor device, the work function metal layer 12 is an n-type work function metal layer. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV.

In one embodiment, the n-type work function metal layer is composed of at least one of TiAl, TanN, TiN, HfN, HfSi, or combinations thereof. The n-type work function metal layer can be deposited using chemical vapor deposition (CVD), atomic layer deposition (ALD), sputtering or plating. In one embodiment, the n-type work function metal layer is composed of titanium aluminum (TiAl) and is deposited using sputtering. As used herein, "sputtering" means a method for depositing a film of metallic material, in which a target of the desired material, i.e., source, is bombarded with particles, e.g., ions, which knock atoms from the target, where the dislodged target material deposits on a deposition surface. Examples of sputtering apparatus that may be suitable for depositing the n-type work function metal layer include DC diode type systems, radio frequency (RF) sputtering, magnetron sputtering, and ionized metal plasma (IMP) sputtering. In one example, an n-type work function metal layer composed of TiN is sputtered from a solid titanium target, in which the nitrogen content of the metal nitride layer is introduced by a nitrogen gas. In another example, an n-type work function metal layer composed of TiN is sputtered from a solid target comprised of titanium and nitrogen. In addition to physical vapor deposition (PVD) techniques, the n-type work function metal layer may also be formed using chemical vapor deposition (CVD) and atomic layer deposition (ALD).

In another embodiment, the work function metal layer 12 may be a p-type work function metal layer. As used herein, a "p-type work function metal layer" is a metal layer that effectuates a p-type threshold voltage shift. In one embodiment, the work function of the p-type work function metal layer 24 ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. In one embodiment, the p-type work function metal layer comprising titanium nitride (TiN) may be deposited by a physical vapor deposition (PVD) method, such as sputtering. Examples of sputtering apparatus that may be suitable for depositing the p-type work function metal layer include DC diode type systems, radio frequency (RF) sputtering, magnetron sputtering, and ionized metal plasma (IMP) sputtering. In addition to physical vapor deposition (PVD) techniques, the p-type work function metal layer may also be formed using chemical vapor deposition (CVD) and atomic layer deposition (ALD).

In one embodiment, the metal work function layer 12 is planarized until the upper surface of the metal work function layer 12 is coplanar with the upper surface of the intralevel dielectric 4, as depicted in FIG. 5. In some examples, the metal work function layer 12 may be planarized using chemical mechanical planarization (CMP).

Figure 6:
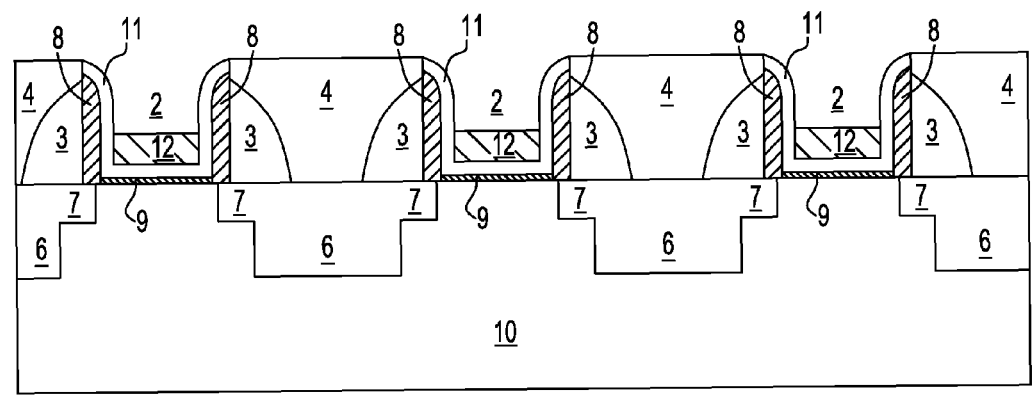
FIG. 6 is a side cross-sectional view of recessing the work function metal layer within the opening, in accordance with one embodiment of the present invention.

FIG. 6 depicts one embodiment of recessing the work function metal layer 12 within the opening 2. The work function metal layer 12 may be recessed by an anisotropic etch. Examples of anisotropic etch process that are suitable for recessing the work function metal layer 12 include reactive ion etch (RIE), ion beam etching, plasma etching or laser ablation. The etch that recesses the work function metal layer 12 may be selective to the intralevel dielectric 4 and the high-k gate dielectric layer 11. Following the recessing of the work function metal layer 12, the remaining portion of the work function metal layer 12 that is present in the opening 2 may have a thickness ranging from 1 nm to 50 nm. In another embodiment, the remaining portion of the work function metal layer 12 that is present in the opening 2 may have a thickness ranging from 5 nm to 30 nm.

Figure 7:
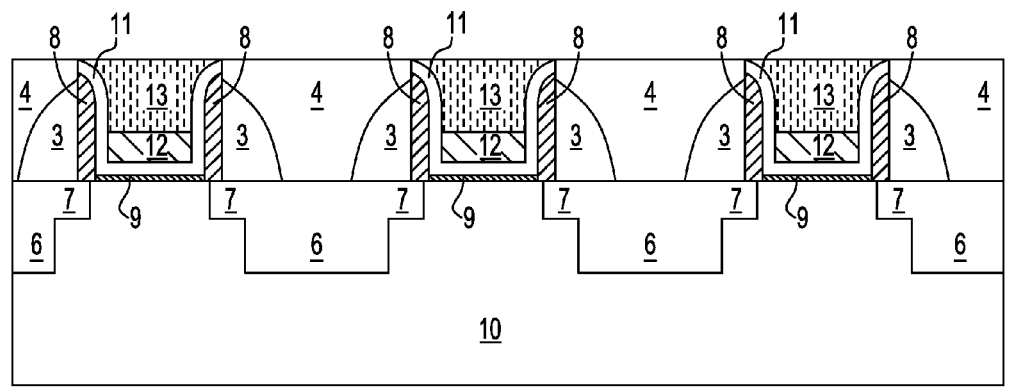
FIG. 7 is a side cross-sectional view of forming a metal-containing layer on the recessed surface of the work function metal layer filling the opening and planarizing the upper surface of the metal-containing layer so that the upper surface of the remaining portion of the metal-containing layer is coplanar with an upper surface of an intralevel dielectric layer, in accordance with one embodiment of the present disclosure.

FIG. 7 depicts one embodiment of forming a metal-containing layer 13 on the recessed surface of the work function metal layer 12. The metal-containing layer 13 may be deposited to fill the opening. In some embodiments, the metal-containing layer 13 is formed in direct contact with the work function metal layer 12. In one embodiment, the metal-containing layer 13 is composed of pure aluminum. In another embodiment, the metal-containing layer 13 is composed of aluminum alloy doped with metals such as Ti or Cu. The metal-containing layer 13 is typically deposited by physical vapor deposition (PVD), such as sputtering or plating. Examples of sputtering apparatus that may be suitable for depositing the metal-containing layer 13 comprising aluminum includes DC diode type systems, radio frequency (RF) sputtering, magnetron sputtering, and ionized metal plasma (IMP) sputtering. In addition to physical vapor deposition (PVD) techniques, the metal-containing layer 13 comprising aluminum may also be formed using chemical vapor deposition (CVD).

In one embodiment, a sputtering deposition process for depositing the metal-containing layer 13 that is composed of aluminum includes applying high energy particles to strike a solid slab of high-purity aluminum target material, in which the high energy particles physically dislodge atoms of the aluminum to be deposited on the work function metal layer 12. In one example, the ion energies of the high-energy particles, e.g., positive ions from an argon gas flow discharge, range from 500 eV to 5,000 eV. In another embodiment, the ion energies of the high-energy particles range from 1,500 eV to 4,500 eV. In one embodiment, by high-purity aluminum it is meant that the aluminum content of the target material is greater than 99.5%. In some embodiments, the aluminum content of the target material may be as great as 99.9% with a remainder of incidental impurities. "Incidental impurities" denote any contamination of the target, i.e., aluminum. Allowable ranges of impurities are less than 0.05 wt % for each impurity constituent, and 0.1 wt % for total impurity content. The sputtered aluminum atoms from the aluminum target may migrate through a vacuum and deposit on the deposition surface, e.g., the work function metal layer 12. In one example, iron (Fe), copper (Cu), and silver (Ag) may be present in less than 5 parts per million (ppm).

The metal-containing layer 13 may be deposited to fill the opening 2. The metal-containing layer 13 may be planarized until an upper surface of the metal-containing layer 13 is coplanar with an upper surface of the intralevel dielectric 4, as depicted in FIG. 7. In one example, the planarization process is provided by chemical mechanical planarization (CMP). In one embodiment, the planarization process removes the portions of the metal-containing layer 13 that is present on the upper surface of the intralevel dielectric 4. The metal-containing layer 13 and the work function metal layer 12 provide the gate conductors of the functioning gate structure. The functioning gate structure is the structure used to control output current, i.e., flow of carriers in the channel, of the semiconducting device, such as a field effect transistor, through electrical or magnetic fields. The functioning gate structure is further composed of the high-k gate dielectric layer 11.

Figure 8:
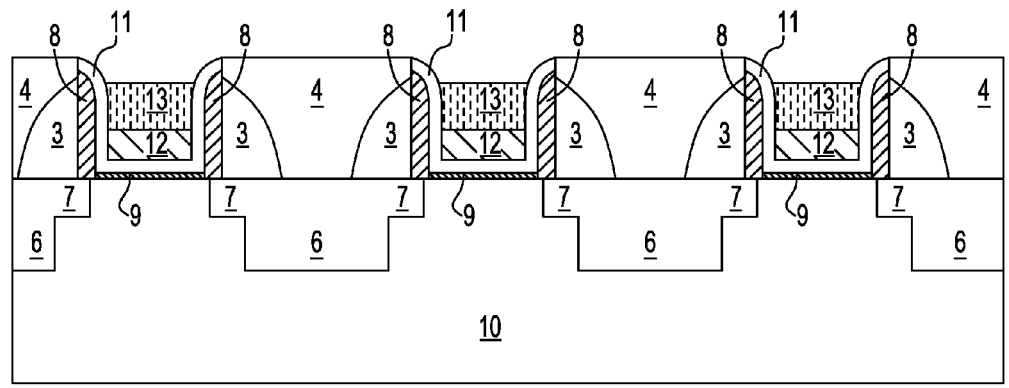
FIG. 8 is a side cross-sectional view of recessing the metal-containing layer within the opening, in accordance with one embodiment of the present disclosure.

FIG. 8 depicts one embodiment of recessing the metal-containing layer 13 within the opening. The metal-containing layer 13 may be recessed by an anisotropic etch. Examples of anisotropic etch process that are suitable for recessing the metal-containing layer 13 include reactive ion etch (RIE), ion beam etching, plasma etching or laser ablation. The etch that recesses the metal-containing layer 13 may be selective to the intralevel dielectric 4 and the high-k gate dielectric layer 11. Following the recessing of the metal-containing layer 13, the remaining portion of the metal-containing layer 13 that is present in the opening may have a thickness ranging from 1 nm to 50 nm. In another embodiment, the remaining portion of the metal-containing layer 13 that is present in the opening may have a thickness ranging from 5 nm to 30 nm.

Figure 9:
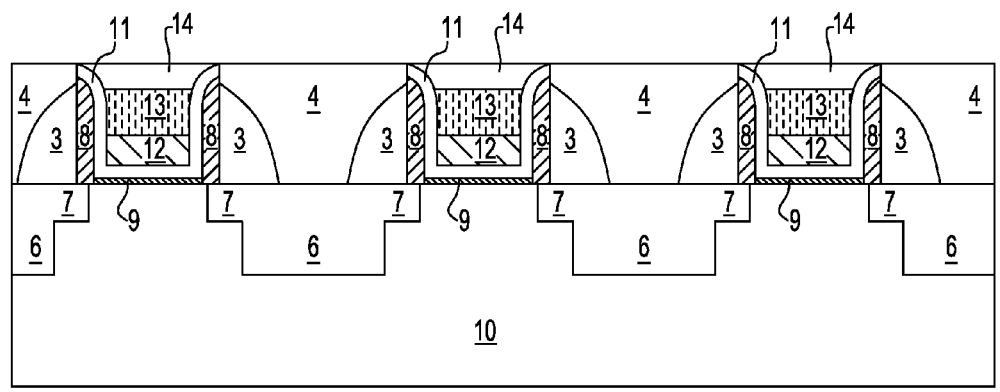
FIG. 9 is a side cross-sectional view of forming a high-k dielectric capping layer on the recessed upper surface of the metal-containing layer, in accordance with one embodiment of the present disclosure.

FIG. 9 depicts one embodiment of forming a high-k dielectric capping layer 14 on the recessed upper surface of the metal-containing layer 13. In one embodiment, the high-k dielectric capping layer 14 may be composed of the same material of at least one of the high-k gate dielectric layer 11 and the high-k dielectric spacer 8. In another embodiment, the high-k dielectric capping layer 14 may be composed of a different material than the high-k gate dielectric layer 11 and the high-k dielectric spacer 8. Similar to the high-k dielectric spacer 8 and the high-k gate dielectric layer 11, the high-k dielectric capping layer 14 may be composed of an oxide, a nitride, an oxynitride or combinations and multi-layers thereof. In one embodiment, the high-k dielectric capping layer 14 is comprised of a material having a dielectric constant that is greater than 4.0, e.g., 4.1. In another embodiment, the high-k dielectric capping layer 14 is comprised of a material having a dielectric constant greater than 7.0. In yet another embodiment, the high-k dielectric capping layer 14 is comprised of a material having a dielectric constant ranging from 4.0 to 30. The dielectric constants mentioned herein are relative to a vacuum at room temperature, i.e., 20° C. to 25° C.

Some examples of suitable materials for the high-k dielectric capping layer 14 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the high-k dielectric capping layer 14 is hafnium oxide ($HfO_2$).

In one embodiment, the high-k dielectric capping layer 14 is formed using a deposition process, such as chemical vapor deposition (CVD). Variations of CVD processes that are suitable for depositing the material layer for the high-k dielectric capping layer 14 include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. In one embodiment, the material layer for the high-k dielectric capping layer 14 is planarized until the upper surface of the high-k dielectric capping layer 14 is coplanar with the upper surface of the intralevel dielectric 4, as depicted in FIG. 9. In some examples, the high-k dielectric capping layer 14 may be planarized using chemical mechanical planarization (CMP).

Figure 10:
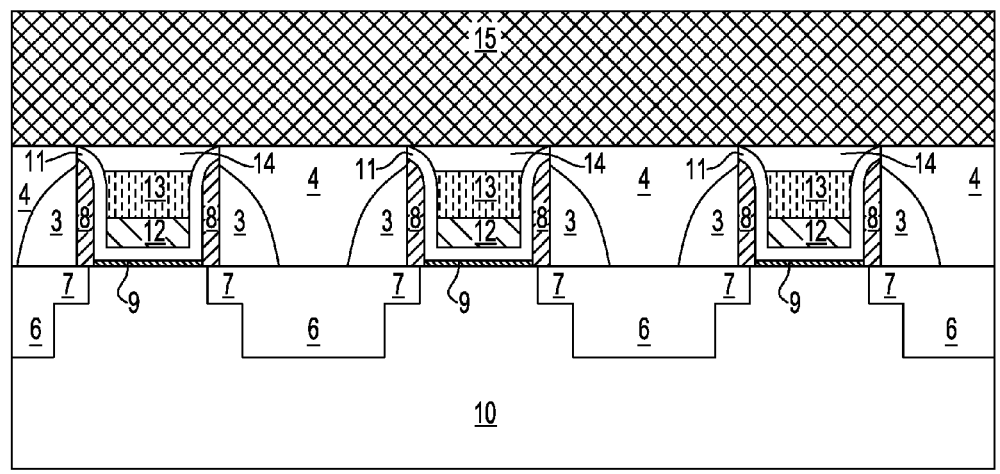
FIG. 10 is a side cross-sectional view of one embodiment of forming an interlevel dielectric layer on the upper surface of the structure that is depicted in FIG. 9.

FIG. 10 depicts one embodiment of forming an interlevel dielectric layer 15 on the upper surface of the structure that is depicted in FIG. 9. The interlevel dielectric layer 15 may be deposited using evaporation, chemical vapor deposition (CVD), chemical solution deposition, spin on deposition, and physical vapor deposition (PVD) methods. The interlevel dielectric layer 15 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, $\alpha$-C:H). Additional choices for the interlevel dielectric layer 15 include: any of the aforementioned materials in porous form, or in a form that changes during processing to or from being porous and/or permeable to being non-porous and/or non-permeable.

The interlevel dielectric layer 15 may be formed by various methods well known to those skilled in the art, including, but not limited to, spinning from solution, spraying from solution, chemical vapor deposition (CVD), plasma enhanced CVD (PECVD), sputter deposition, reactive sputter deposition, ion-beam deposition, and evaporation.

Figure 11:
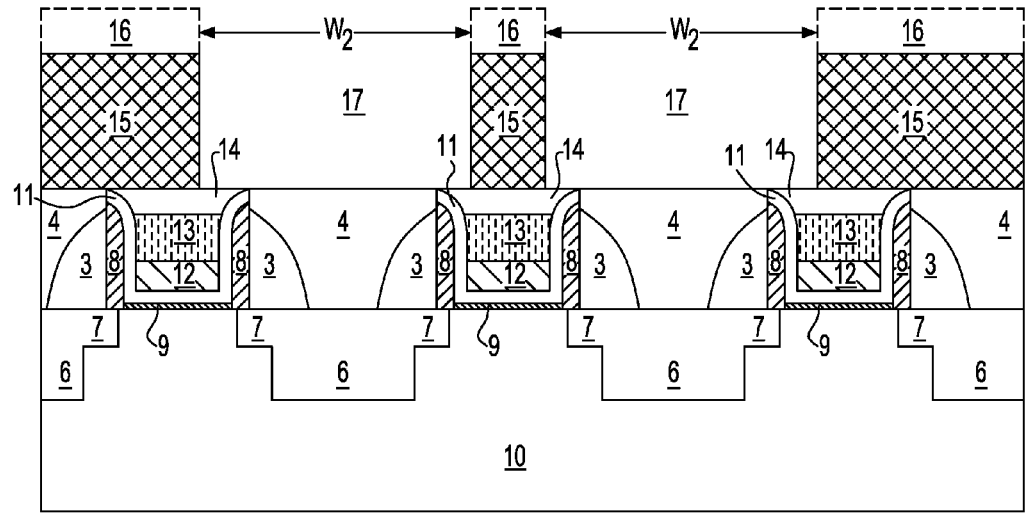
FIG. 11 is a side cross-sectional view of patterning and etching the interlevel dielectric layer, in accordance with one aspect of the present disclosure.
Figure 12:
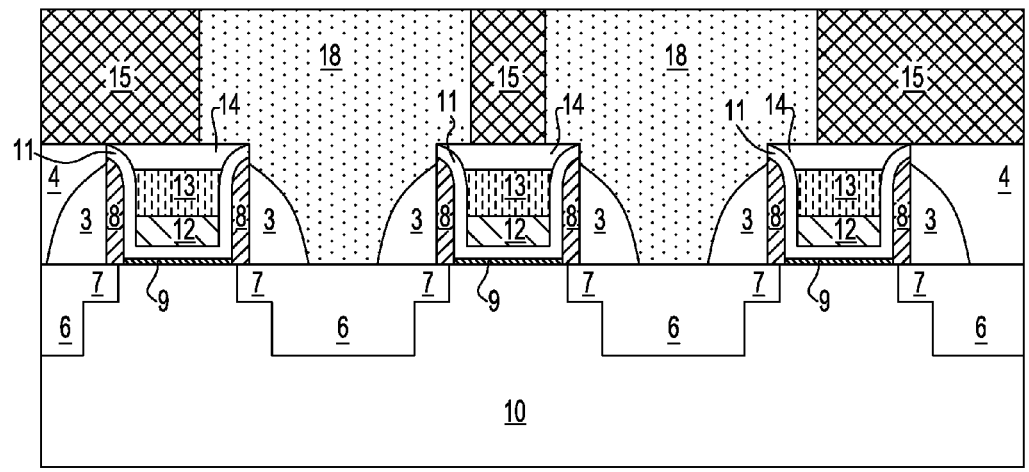
FIG. 12 is a side cross-sectional view of forming contacts through the intralevel dielectric layer to at least one of the source region and the drain region, using an etch that provides the opening for the contact via which is selective to the high-k dielectric spacer, in accordance with one aspect of the present disclosure.

Referring to FIGS. 11-12, the interlevel dielectric layer 15 is patterned and etched to form via holes 17 to the various source and drain regions, i.e., source and drain extension regions 7 and deep source and drain regions 6, of the substrate 10. A photoresist etch mask 16 can be produced by applying a photoresist layer to the surface of the interlevel dielectric layer 15, exposing the photoresist layer to a pattern of radiation, and then developing the pattern into the photoresist layer utilizing a resist developer. As depicted in FIG. 11, the photoresist etch mask 16 may be positioned so that the gate conductors are not entirely protected by the photoresist etch mask 16. The etch that forms the via holes 17 to the source and drain regions, i.e., source and drain extension regions 7 and deep source and drain regions 6, is selective to the high-k dielectric capping layer 14, and the high-k dielectric spacers 8. Therefore, the etch does not damage the gate conductor, i.e., metal-containing layer 13 and the work function metal layer 12, of the gate structure, which is encapsulated in the high-k dielectric capping layer 14 and the high-k dielectric spacers 8. Although not depicted in FIGS. 11 and 12, the etch that forms the via holes 17 may remove at least a portion of the low-k dielectric spacer 3.

Because, the etch that is forming the via holes 17 is selective to the high-k dielectric capping layer 14 and the high-k dielectric spacers 8 it is not critical that the photoresist etch mask 16 be aligned to protect the underlying gate structure. Further, because of the high-k dielectric capping layer 14, and the high-k dielectric spacers 8, the etch process that is used to form the via holes 17 is said to be self aligned to the source and drain regions, i.e., source and drain extension regions 7 and deep source and drain regions 6, as well as the gate structure.

FIG. 11 depicts forming the photoresist mask 16 on an upper surface of the interlevel dielectric layer 15. The width W2 of the openings 17 in the photoresist mask 16 may span over the entire portion of the intralevel dielectric layer 4 that is present separating the adjacent gate structures. In one embodiment, the width W2 of the openings 17 in the photoresist mask 15 may range from 20 nm to 200 nm. In another embodiment, the width W2 of the openings 17 may range from 30 nm to 150 nm. In an even further embodiment, the width W2 of the openings 17 may range from 50 nm to 100 nm.

The exposed portion of the interlevel dielectric layer 15 is then removed by a selective etch. The selective etch may be an anisotropic etch or an isotropic etch. In one embodiment, the via holes 17 are first formed in the interlevel dielectric 15 with an etch that terminates on the intralevel dielectric 4, as depicted in FIG. 11. Referring to FIG. 12, the via holes 17 are then extended through the intralevel dielectric layer 4 to the source and drain regions, i.e., deep source and drain regions 6 and source and drain extension regions 7, that are present within the substrate 10. In one embodiment, the etch that removes the exposed portions of the intralevel dielectric layer 4 is selective to the photoresist mask 16, the high-k dielectric capping layer 14, the high-k dielectric spacers 8 and the source and drain regions of the substrate 10. In one example, when the interlevel dielectric layer 4 is composed of nitride stress inducing material, the high-k dielectric capping layer 14 is composed of hafnium oxide ($HfO_2$), the high-k dielectric spacers 8 are composed of hafnium oxide ($HfO_2$), and the substrate 10 is composed of silicon, the etch chemistry for extending the via holes 17 to the source and drain regions, i.e., deep source and drain regions 6 and source and drain extension regions 7, is composed of fluorine based chemical, such as $CF_4$, $CClF_2$, $SF_6$ and combinations thereof.

Following via hole 17 formation, interconnects 18 (hereafter referred to as "contacts") are formed by depositing a conductive metal into the via holes using deposition methods, such as CVD or plating. The conductive metal may include, but is not limited to, tungsten, copper, aluminum, silver, gold, and alloys thereof.

Although the intralevel dielectric layer 4 is depicted as being removed in its entirety from between the adjacent gate structures, when the intralevel dielectric layer 4 is a stress inducing material, a portion of the intralevel dielectric layer in one of the surrounding areas of the substrate may remain to provide stress induced performance enhancements to the semiconductor devices. Further, the contact to the upper surface of the gate conductor, i.e., metal-containing layer 13, is provided outside the active region of the substrate 10. For example, the metal-containing layer 13 of the gate structure may extend onto an isolation region portion (not shown) of the substrate 10, at which a contact is formed to the metal-containing layer 13 to provide contact to the gate structure. The contact to the gate structure may be formed through the high-k dielectric capping layer 14.

FIGS. 13-16 depict another embodiment of the present disclosure that provides a self-aligned method for forming a contact to the source and drain regions of the semiconductor devices of a complementary metal oxide semiconductor (CMOS) device. A complementary metal oxide semiconductor (CMOS) device includes an n-type conductivity semiconductor device, e.g., nFET, in a first device region 105 of a substrate 10, and forming a p-type conductivity semiconductor device, e.g., pFET, in the second device region 110. Separating the first device region 105 from the second device region 110 is an isolation region 115, such as a dielectric filled shallow trench isolation (STI) region. The initial process steps for forming the structure depicted in FIG. 13 are similar to the process sequence that is depicted in FIGS. 1-4, with the exception that the first device region 105 has been processed for an n-type semiconductor device and the second device region 110 has been processed for a p-type semiconductor device. An isolation region 115, such as a shallow trench isolation region, may be present separating the first device region 105 from the second device region 110. The shallow trench isolation (STI) region may be formed by etching a trench in the substrate 10 utilizing a dry etching process such as reactive-ion etching (RIE) or plasma etching. The trenches may optionally be lined with a liner material, e.g., an oxide, and then chemical vapor deposition (CVD), or another like deposition process is used to fill the trench with a dielectric material, such as silicon oxide ($SiO_2$). The first device region 105 and the second device region 110 may be independently processed to provide the n-type and p-type semiconductor devices using block masks. The block masks that are used to allow for independent processing of the first device region 105 and the second device region 110 may be composed of soft and/or hardmask materials and can be formed using deposition, photolithography and etching.

For example, a first block mask (not shown) is formed protecting the first device region 105 of the substrate 10 in which pFETs are subsequently formed. The exposed portion of the substrate 10, which includes the second device region 110, that is not protected by the first block mask is subsequently processed to provide nFET. For example, the source and drain regions, i.e., source and drain extension regions 7 and deep source and drain regions 6, are implanted using a p-type dopant into the second device region 110, while the first device region 105 is protected by the second block mask. The first block mask is then removed, and a second block mask (not shown) is formed protecting the second device region 110 of the substrate 10, while the first device region 105 is exposed. Source and drain regions, i.e., source and drain extension regions 7 and deep source and drain regions 6, are implanted into the first device region 105 using a n-type dopant, while the second device region 110 is protected by the second block mask. Block masks may also be utilized to provide different compositions or processing for the intralevel dielectrics that are present in the first device region 105 and the second device region 110. For example, the first device region 105 may have an intralevel dielectric 4a that induces a tensile stress on the n-type semiconductor devices contained therein, and the second device region 110 may have an intralevel dielectric 4b that induces a compressive stress on the p-type semiconductor devices contained therein.

FIG. 13 depicts forming a layer of a second work function metal layer 111 within the second device region 110 of the substrate 10. For the embodiment illustrated in FIG. 13, the second work function metal layer 111 is a p-type work function metal layer. In one embodiment, the p-type work function metal layer is composed of TiN. The p-type work function metal layer may also be composed of TiAlN, Ru, Pt, Mo, Co and alloys and combinations thereof.

In one embodiment, the p-type work function metal layer may be blanket deposited atop the entire structure depicted in FIG. 4 by a physical vapor deposition (PVD) method, such as sputtering or plating. Examples of sputtering apparatus that may be suitable for depositing the p-type work function metal layer include DC diode type systems, radio frequency (RF) sputtering, magnetron sputtering, and ionized metal plasma (IMP) sputtering. In addition to physical vapor deposition (PVD) techniques, the p-type work function metal layer may also be formed using chemical vapor deposition (CVD) and atomic layer deposition (ALD). At least a portion of the second work function metal layer 111 is present on the sidewalls of the high-k dielectric spacer 8 and the high-k gate dielectric layer 11 that is present within the opening 2 to the substrate 10 within the second device region 110. In one embodiment, the thickness of the second work function metal layer 111 may range from 1 nm to 10 nm. In another embodiment, the thickness of the second work function metal layer 111 may range from 2 nm to 5 nm. In an even further embodiment, the thickness of the second work function metal layer 111 may range from 3 nm to 4 nm. The second work function metal layer 111 may be deposited over the first device region 105 and the second device region 110 of the substrate 10, and then removed from the first device region 105 by forming an etch mask (not shown) over the second device region 110 and etching the second work function metal layer 111 selective to the etch mask and the high-k gate dielectric layer 11. The etch mask is then removed using selective etching, chemical stripping or oxygen ashing.

FIG. 14 depicts one embodiment of forming a first work function metal layer 112 within the openings in the first device region 105 and second device region 110 of the substrate 10. The first work function metal layer 112 may be blanket deposited on the first device region 110 of the substrate 10 and the second device region 115 of the substrate 10. In one embodiment, the first work function metal layer 112 is an n-type work function metal layer.

The n-type work function metal layer may be composed of at least one of titanium aluminum (TiAl), TiN, HfN, HfSi, or combinations thereof. The n-type work function metal layer can be deposited using chemical vapor deposition (CVD), atomic layer deposition (ALD), sputtering or plating. In one embodiment, the n-type work function metal layer is composed of titanium aluminum (TiAl) and is deposited using sputtering. In one example, an n-type work function metal layer composed of titanium aluminum (TiAl) is sputtered from a solid titanium target, in which the nitrogen content of the metal nitride layer is introduced by a nitrogen gas.

Following deposition, the first work function metal layer 112 may be planarized until the upper surface of the first work function metal layer 112 that is present in the openings of the first device region 105 and the second device region 110 is coplanar with the upper surface of the intralevel dielectric 4a, 4b as depicted in FIG. 14. The planarization process may remove the portions of the high-k gate dielectric layer 11, the second work function metal layer 111, and the first work function metal layer 112 that are present on the upper surface of the intralevel dielectric layer 4a, 4b. In some examples, the planarization process may be chemical mechanical planarization (CMP).

FIG. 15 depicts one embodiment of recessing the first work function metal layer 112 within the openings that are present in the first device region 105 and the second device region 110. The first work function metal layer 112 may be recessed by an anisotropic etch. Examples of anisotropic etch process that are suitable for recessing the work function metal layer 112 include reactive ion etch (RIE), ion beam etching, plasma etching or laser ablation. The etch that recesses the first work function metal layer 112 may be selective to the intralevel dielectric 4 and the high-k gate dielectric layer 11.

Following the recessing of the first work function metal layer 112, the remaining portion of the first work function metal layer 112 that is present in the openings of the first device region 105 may have a thickness ranging from 1 nm to 50 nm. In another embodiment, the remaining portion of the work function metal layer 112 that is present in the openings of the first device region 105 may have a thickness ranging from 5 nm to 30 nm. The remaining portion of the work function metal layer 112 that is present in the openings of the second device region 110 may have a thickness ranging from 1 nm to 50 nm. In another embodiment, the remaining portion of the work function metal layer 112 that is present in the opening of the second device region 110 have a thickness ranging from 5 nm to 30 nm.

FIG. 15 depicts one embodiment of forming a metal-containing layer 113 on the recessed surface of the work function metal layer 112. The metal-containing layer 113 that is depicted in FIG. 15 is similar to the metal-containing layer 13 that is described above with reference to FIGS. 7 and 8. Therefore, the above description for the metal-containing layer 13 is equally applicable to the metal-containing layer 113 that is depicted in FIG. 15. FIG. 15 also depicts one embodiment of a high-k dielectric capping layer 114 that is present on a recessed surface of the metal-containing layer 113 in the first device region 105 and the second device region 110. The high-k dielectric capping layer 114 that is depicted in FIG. 15 is similar to the high-k dielectric capping layer 14 that is described above with reference to FIG. 9. Therefore, the above description for the high-k dielectric capping layer 14 is equally applicable to the high-k dielectric capping layer 114 that is depicted in FIG. 15.

Figure 17:
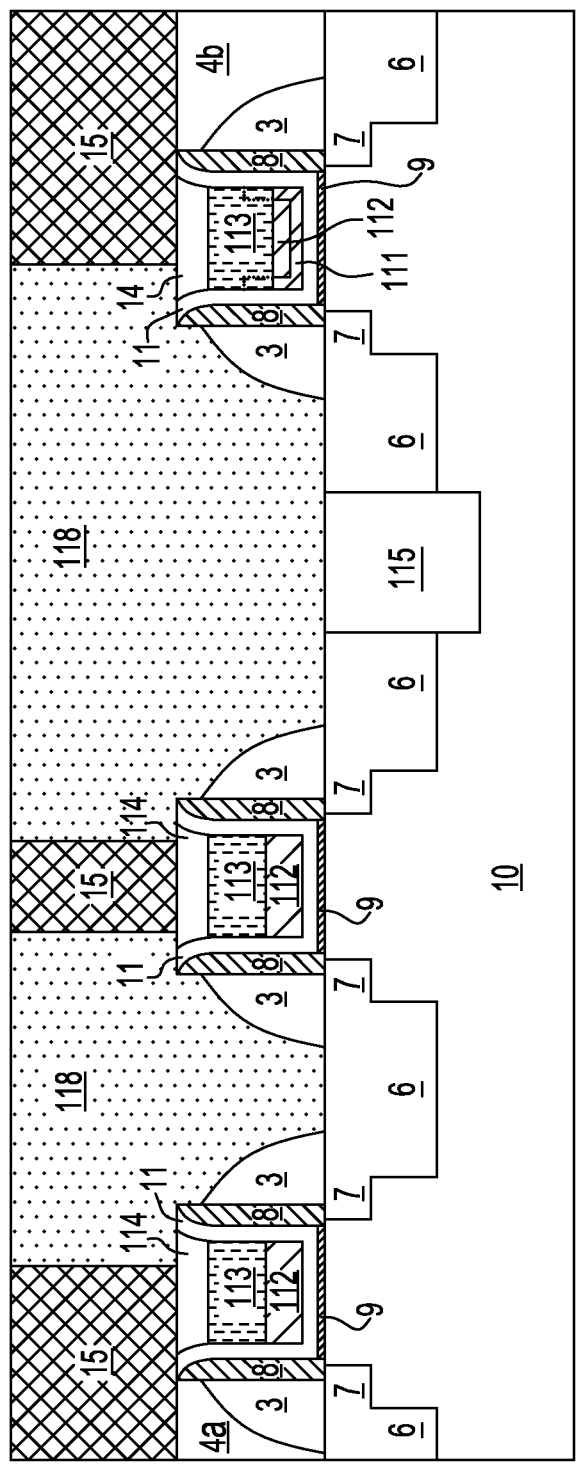

FIGS. 16 and 17 depict one embodiment of forming contacts 118 through the intralevel dielectric layer 4 to at least one of the source region and the drain region, i.e., source and drain extension region 7 and deep source and drain region 6, wherein the etch that provides the opening 117 for the contact 118 is selective to the high-k dielectric spacer 8. The openings 117 that are depicted in FIG. 16 are similar to the openings 17 that are described above with reference to FIG. 11. Therefore, the above description for the opening 17 that is depicted in FIG. 11 is equally applicable to the opening 117 that is depicted in FIG. 16. The contacts 118 that are depicted in FIG. 17 are similar to the contacts 18 that are described above with reference to FIG. 12. Therefore, the above description for the contacts 18 is equally applicable to the contacts 118 that are depicted in FIG. 17.

FIGS. 12 and 17 depict some embodiments of a semiconductor device that includes a gate structure that is composed of a gate conductor and a high-k gate dielectric layer 11, wherein the high-k gate dielectric layer 11 is in contact with the base of the gate conductor and the sidewalls of the gate conductor. A high-k dielectric capping layer 14, 114 is present on an upper surface of the gate conductor. Source regions and drain regions are present in the substrate 10 on opposing sides of the gate structure.

While the present disclosure has been particularly shown and described with respect to preferred embodiments thereof, it will be understood by those skilled in the art that the foregoing and other changes in forms and details may be made without departing from the scope and spirit of the present disclosure. It is therefore intended that the present disclosure not be limited to the exact forms and details described and illustrated, but fall within the scope of the appended claims.

What is claimed is:

1. A method of forming a semiconductor device comprising:
    forming a replacement gate structure on a portion of a substrate, wherein source regions and drain regions are formed in opposing sides of the portion of the substrate that the replacement gate structure is formed on;
    forming an intralevel dielectric on the substrate having an upper surface that is coplanar with an upper surface of the replacement gate structure;
    removing the replacement gate structure to provide an opening to an exposed portion of the substrate;
    forming a high-k dielectric spacer on sidewalls of the opening;
    forming a gate dielectric on the exposed portion of the substrate;
    forming a functioning gate structure within the opening on the gate dielectric, wherein an upper surface of the functioning gate structure is a high-k dielectric capping layer;
    and
    forming contact vias through the interlevel dielectric layer to at least one of the source region and the drain region, wherein an etch that provides the opening for the contact via is selective to the high-k dielectric spacer and the high-k dielectric capping layer.

2. The method of claim 1, wherein the functioning gate structure includes a work function metal layer that is present on the gate dielectric.

3. The method of claim 1, wherein prior to forming the intralevel dielectric layer, low-k dielectric spacers are formed adjacent to the replacement gate structure.

4. The method of claim 3, wherein the forming of the intralevel dielectric layer on the substrate having an upper surface that is coplanar with an upper surface of the replacement gate structure comprises depositing the intralevel dielectric layer over the substrate and the replacement gate structures, and planarizing the intralevel dielectric layer until the upper surface of the replacement gate structure is exposed.

5. The method of claim 3, wherein the removing of the replacement gate structure to provide an opening to an exposed portion of the substrate comprises an etch that removes the replacement gate structure selective to the low-k dielectric spacer, the substrate and the intralevel dielectric layer.

6. The method of claim 3, wherein the forming of the high-k dielectric spacer on the sidewalls of the opening comprises depositing a conformal high-k dielectric layer on sidewalls of the low-k dielectric spacer that are exposed by removing the replacement gate structure, etching the conformal high-k dielectric layer so that a remaining portion of the conformal high-k dielectric layer is present on the sidewalls of the low-k dielectric spacer, which provide the sidewalls of the opening.

7. The method of claim 3, wherein the forming of the gate dielectric further comprises forming an interfacial dielectric layer on a base portion of the opening, and forming a high-k gate dielectric layer on the interfacial dielectric layer.

8. The method of claim 7, wherein the forming of the work function metal layer on the exposed portion of the substrate comprises depositing titanium aluminum (TiAl) when the semiconductor device is an n-type conductivity semiconductor device or depositing titanium nitride (TiN) when the semiconductor device is a p-type conductivity semiconductor device.

9. The method of claim 3 further comprising forming a metal-containing layer on the work function metal layer filling the opening.

10. The method of claim 9 wherein an upper surface of the metal-containing layer is recessed below an upper surface of the high-k dielectric spacer.

11. The method of claim 10, wherein a high-k dielectric capping layer is formed on the upper surface of the metal-containing layer that has been recessed, wherein the high-k dielectric capping layer in combination with the high-k dielectric spacer encapsulate the work function metal layer and the metal-containing layer.

12. The method of claim 11, wherein the etch for forming the opening through the intralevel dielectric layer for the contact to at the least one of the source region and the drain region is an anisotropic etch that is selective to the high-k dielectric spacer and the high-k dielectric capping layer.

13. A method of forming a complementary metal oxide semiconductor (CMOS) device comprising:
   providing a first replacement gate structure within a first device region of a substrate and a second replacement gate structure within a second device region of the substrate, wherein the first device region comprises first source regions and first drain regions of a first conductivity type and the second device region comprises second source regions and second drain regions of a second conductivity type;
   forming an intralevel dielectric on the substrate having an upper surface that is coplanar with an upper surface of the first replacement gate structure and the second replacement gate structure;
   removing the first replacement gate structure and the second replacement gate structure to provide openings to a first exposed portion of the substrate in the first device region and a second exposed portion of the substrate in a second device region of the substrate;
   forming a high-k dielectric spacer on sidewalls of each of the openings to the first exposed portion of the substrate and the second exposed portion of the substrate;
   forming a gate dielectric on each of the first exposed portion and the second exposed portion of the substrate;
   forming a first work function metal layer on the gate dielectric that is present in the first device region and forming a second work function metal layer on the gate dielectric in the second device region of the substrate;
   forming a high-k dielectric capping layer over the first work function metal layer and the second work function metal layer; and
   forming contacts through the intralevel dielectric layer to at least one of the source region and the drain region, wherein an etch that provides the opening for the contacts is selective to the high-k dielectric spacer and the high-k dielectric capping layer.

14. The method of claim 13, wherein the first conductivity type is an n-type conductivity and the second conductivity type is a p-type conductivity.

15. The method of claim 14, wherein the first work function metal layer comprises titanium aluminum (TiAl) and the second work function metal layer comprises titanium nitride (TiN).

* * * * *